(12) United States Patent
Maekawa et al.

(10) Patent No.: US 8,125,085 B2
(45) Date of Patent: Feb. 28, 2012

(54) SEMICONDUCTOR DEVICE HAVING WIRING WITH OXIDE LAYER OF IMPURITY FROM THE WIRING

(75) Inventors: Kazuyoshi Maekawa, Tokyo (JP); Kenichi Mori, Tokyo (JP); Kazuyuki Omori, Tokyo (JP); Yuki Koyama, Itami (JP)

(73) Assignee: Renesas Electronics Corporation, Kanagawa (JP)

( * ) Notice: Subject to any disclaimer, the term of this patent is extended or adjusted under 35 U.S.C. 154(b) by 91 days.

(21) Appl. No.: 12/481,234

(22) Filed: Jun. 9, 2009

(65) Prior Publication Data
US 2010/0044864 A1    Feb. 25, 2010

(30) Foreign Application Priority Data
Aug. 22, 2008 (JP) ................................. 2008-213563

(51) Int. Cl.
    *H01L 23/48* (2006.01)
    *H01L 29/80* (2006.01)
    *H01L 21/3205* (2006.01)
    *H01L 21/768* (2006.01)

(52) U.S. Cl. ........... 257/751; 257/E23.011; 257/E23.06; 257/E21.586; 257/E21.295; 257/257; 257/770; 257/762; 257/763; 257/760; 257/306; 257/785; 257/765; 257/680; 257/774; 438/653; 438/618; 438/687; 438/622; 438/627; 438/631; 438/643; 438/637; 427/304; 427/123

(58) Field of Classification Search .......... 257/257, 257/E21.262, E21.311, E21.576, 774, 680, 257/765, E21.586, E23.06, E21.295, E23.011, 257/762, 306, 760, 763, 770, 751; 438/637, 438/643, 627, 622, 687, 618; 427/123, 304
See application file for complete search history.

(56) References Cited

U.S. PATENT DOCUMENTS

| | | | |
|---|---|---|---|
| 7,413,977 B2 | 8/2008 | Shimizu et al. | |
| 7,545,040 B2* | 6/2009 | Ueki et al. | 257/751 |
| 7,687,917 B2* | 3/2010 | Ohto et al. | 257/774 |
| 2003/0209738 A1* | 11/2003 | Ohto et al. | 257/257 |
| 2004/0004288 A1* | 1/2004 | Sekiguchi | 257/758 |

(Continued)

FOREIGN PATENT DOCUMENTS

| | | |
|---|---|---|
| JP | 2007-059734 | 3/2007 |
| JP | 2007-067107 | 3/2007 |
| JP | 2007-180407 | 7/2007 |

(Continued)

OTHER PUBLICATIONS

K. Higashi et al., "Highly Reliable PVD/ALD/PVD Stacked Barrier Metal Structure for 45nm-Node Copper Dual-Damascene Interconnects," International Interconnect Technology Conference 2004.

*Primary Examiner* — A O Williams
(74) *Attorney, Agent, or Firm* — McDermott Will & Emery LLP

(57) ABSTRACT

A semiconductor device includes an interlayer film formed over a semiconductor substrate. A groove is formed in the interlayer film. A wiring formed in the groove is a copper alloy including copper and a metal element. An oxide layer of the metal element is formed over the surface of the wiring. The oxide layer is formed in a first region along a grain boundary of a copper crystal and a second region surrounded by the grain boundary, over the surface of the wiring. The oxide layer formed in the first region has a thickness greater than that of the oxide layer formed in the second region.

16 Claims, 5 Drawing Sheets

U.S. PATENT DOCUMENTS

| | | | |
|---|---|---|---|
| 2004/0266169 A1* | 12/2004 | Sakata | 438/622 |
| 2004/0266171 A1* | 12/2004 | Aoki et al. | 438/622 |
| 2005/0035454 A1* | 2/2005 | Kishida et al. | 257/751 |
| 2005/0069646 A1* | 3/2005 | Inoue et al. | 427/304 |
| 2006/0043589 A1* | 3/2006 | Iwasaki | 257/751 |
| 2007/0145591 A1 | 6/2007 | Yano et al. | |
| 2008/0122102 A1* | 5/2008 | Sakata et al. | 257/763 |
| 2010/0193953 A1* | 8/2010 | Amano et al. | 257/751 |
| 2010/0224995 A1* | 9/2010 | Ohto et al. | 257/751 |

* cited by examiner

SEMICONDUCTOR DEVICE HAVING WIRING WITH OXIDE LAYER OF IMPURITY FROM THE WIRING

CROSS REFERENCE TO RELATED APPLICATIONS

The disclosure of Japanese Patent Application No. 2008-213563 filed on Aug. 22, 2008 including the specification, drawings and abstract is incorporated herein by reference in its entirety.

BACKGROUND OF THE INVENTION

The present invention relates to a method of manufacturing a semiconductor device and to a semiconductor device, and, in particular, to a method of manufacturing a semiconductor device and to a semiconductor device, the semiconductor device having wiring and a via plug containing copper as a component.

For wiring layers of semiconductor devices in recent years, Cu (copper) damascene wirings having high reliability and high performance have been frequently used. Hereinafter, the conventional manufacturing procedure of Cu damascene wiring in semiconductor devices will be described.

Firstly, over a semiconductor substrate in which electronic parts including transistors have been formed, a first interlayer insulating film is formed. Next, in the first interlayer insulating film, grooves for lower layer wiring having a prescribed shape are formed. Next, over the first interlayer insulating film including a bottom face and a side face of the groove for lower layer wiring, a barrier metal film formed by laminating a TaN film and a Ta film is formed. Then, over the barrier metal film, a Cu seed film is formed.

Next, over the Cu seed film, a plated Cu film is formed by a plating method. The surface of the plated Cu film thus formed is formed so as to be higher than the upper surface of the first interlayer insulating film. Next, a heat treatment is performed for the purpose of growing copper grains of the plated Cu film. After that, an excess Cu film is removed by CMP (Chemical Mechanical Polishing) until the seed Cu film and the first interlayer insulating film having been formed in the groove for lower layer wiring are exposed. As a result, lower layer Cu wiring is formed in the groove for the lower layer wiring.

Next, over the first interlayer insulating film in which the lower layer Cu wiring has been formed, a copper diffusion-preventing film for suppressing the diffusion of Cu into the interlayer insulating film is formed. Then, over the copper diffusion-preventing film, a second interlayer insulating film having insulating material is formed. Next, at a prescribed position of the second interlayer insulating film, a contact hole that reaches the lower layer Cu wiring is formed. Further, in the second interlayer insulating film, grooves for upper layer wiring are formed. Here, a part of the bottom face of the groove for the upper layer wiring is connected with the upper face of the contact hole.

Next, in the contact hole and the groove for the upper layer wiring, a barrier metal film including a TaN film and a Ta film is formed. Next, over the barrier metal film, a Cu seed film is formed. Next, over the Cu seed film, a plated Cu film is formed by a plating method. Then, excess portions of the Cu film are removed by CMP. This results in the formation of upper layer Cu wiring in the upper layer wiring groove, and the formation of a contact plug in the contact hole.

Meanwhile, as prior arts for the Cu damascene wiring, for example, there is Non-patent Document 1 (K. Higashi, H. Yamaguchi, S. Omoto, A. Sakata, T. Katata, N. Matsunaga and H. Shibata, "Highly Reliable PVD/ALD/PVD stacked Barrier Metal Structure for 45 nm-Node Copper Dual-Damascene Interconnects", International Interconnect Technology Conference 2004). Further, there are Patent Documents 1, 2 and 3 below.

Patent Document 1 (Japanese Unexamined Patent Publication No. 2007-59734) discloses following techniques. At first, in the formation of buried Cu wiring, a Cu alloy containing such metal as Al that has a large diffusion coefficient in Cu and a lower formation energy of the oxide than that of copper is formed as the seed layer. Then, after the wiring Cu is buried, a heat treatment is performed to diffuse the contained metal. Thus, the oxide of the contained metal such as aluminum oxide is formed over the surface of the wiring to constitute a barrier film.

Patent Document 2 (Japanese Unexamined Patent Publication No. 2007-180407) discloses following techniques. Firstly, buried Al-containing Cu wiring is formed by the diffusion of Al from an Al-containing Cu seed layer. Then, aluminum oxide formed over the surface thereof remains as it is, it is removed together with a barrier metal when a connecting via with upper layer wiring is formed, and lower layer CuAl wiring is etched to form a barrier metal and via metal.

Patent Document 3 (Japanese Unexamined Patent Publication No. 2007-67107) discloses following techniques. A treatment is performed in an oxidative atmosphere so as to diffuse contained metals from a seed layer containing other metals (such as Mn and Al) than Cu into copper being wiring metal. This results in the formation of an oxide film of the diffused metal over the surface of the copper wiring metal to form a covering layer.

SUMMARY OF THE INVENTION

Incidentally, for devices using Cu wiring starting from a leading-edge SoC (System On a Chip), it is an important subject to improve the reliability thereof. In order to improve the reliability, the diffusion of copper atoms and holes in the Cu wiring should be suppressed. More specifically, it is necessary to suppress the diffusion of copper atoms and the like from the surface of the copper wiring.

Meanwhile, in Patent Documents 1-3, a seed layer containing Cu metal and other additive metals is formed, the seed layer is subjected to a Cu plating treatment, and then the layer is heat-treated in oxygen atmosphere to form the oxide of the additive metal over the surface of the Cu-plated film, while allowing the additive metal to diffuse into the Cu metal. Consequently, there is such a problem that the concentration of the additive metal element in the Cu-plated film lowers to lower the electromigration resistance.

Therefore, an object of the present invention is to provide a method of manufacturing a semiconductor device capable of suppressing the metal diffusion from the upper surface portion of wiring.

In one embodiment according to the present invention, a copper alloy layer containing copper and a first metal element is formed on the bottom face and the side face of a groove formed in a first interlayer film over a semiconductor substrate. Then, a copper layer is formed so as to fill the groove. Then, a first heat treatment is performed in a first atmosphere where no oxidation of the copper layer occurs, and thereby the copper layer is made into a metal layer of a copper alloy including the alloy of copper and the first metal element. Then, an excess metal layer of the copper alloy is removed, and thereby wiring is formed in the groove. After that, a second heat treatment is performed in a second atmosphere containing oxygen, and thereby an oxide layer being the oxide of the first metal element is formed over the wiring surface.

According to the above embodiment, the oxide layer containing the first metal element can more suppress the diffusion of copper and holes at the upper face of the copper alloy wiring, as compared with metal diffusion-preventing films (SiCN, SiN) that are generally adopted for the purpose of preventing the diffusion of copper. That is, by forming the oxide layer, it is possible to retard the diffusion of copper and holes at the upper face of copper alloy wiring. Accordingly, as a result, such faults as electromigration and stress migration of copper alloy wiring can be suppressed.

DETAILED DESCRIPTION OF THE PREFERRED EMBODIMENTS

Hereinafter, the present invention will be described specifically on the basis of the drawings illustrating embodiments thereof.

Embodiment 1

Hereinafter, a method of manufacturing a semiconductor device according to an embodiment 1 will be described on the basis of process cross-sectional views.

Figure 1:
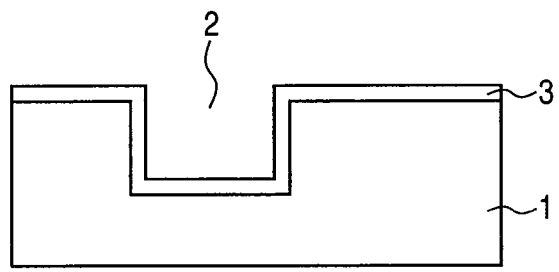
FIG. 1 is a process cross-sectional view for illustrating a method of manufacturing a semiconductor device according to an embodiment 1.

Firstly, as shown in FIG. 1, over a semiconductor substrate (not shown) in which electronic parts including a transistor have been formed, a first interlayer insulating film (that may be comprehended as a first interlayer film) 1 is formed. Then, within the surface of the first interlayer insulating film 1, a groove 2 having a prescribed shape for lower layer wiring is formed (refer to FIG. 1) by a general photolithographic technology.

Further, for the upper face of the first interlayer insulating film 1 and for the inside of the groove 2 for lower layer wiring, a film-forming treatment is provided by a sputtering treatment or a CVD (Chemical Vapor Deposition) method. This causes the formation of a first barrier metal 3 on the bottom and side faces of the groove 2 for lower layer wiring, and over the first interlayer insulating film 1, as shown in FIG. 1. Here, the first barrier metal 3 is a laminated film of a TaN film and a Ta film. As the first barrier metal 3, a film that contains at least any of second metal element selected from tantalum, tungsten, titanium, ruthenium, magnesium and vanadium, nitride with the second metal element, or oxide with the second metal element can be adopted.

Figure 2:
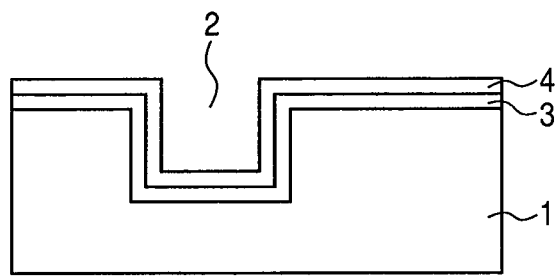
FIG. 2 is a process cross-sectional view for illustrating the method of manufacturing the semiconductor device according to the embodiment 1.

Next, the first barrier metal 3 is subjected to a sputtering treatment. This results in the formation of a Cu (copper) alloy seed film (that may be comprehended as a copper alloy layer) 4 over the first barrier metal 3, as shown in FIG. 2. Specifically, the Cu alloy seed film 4 containing copper and the first metal element is formed on the bottom and side faces of the groove 2 for lower layer wiring, and over the first interlayer insulating film 1, via the first barrier metal 3.

Here, the Cu alloy seed film 4 is formed by a sputtering treatment employing a target containing, for example, Al (aluminum) from not less than 0.1 at. % to not more than 10 at. %. On this occasion, the Cu alloy seed film 4 is a CuAl alloy seed film.

As the first metal element, a metal element including any of Al (aluminum), Ti (titanium), Mn (manganese), Sn (tin), Ag (silver) and Mg (magnesium) is employable. On this occasion, the Cu alloy seed film 4 is formed by a sputtering treatment employing a target containing, for example, any of the above metal elements from not less than 0.1 at. % to not more than 10 at. %.

Figure 3:
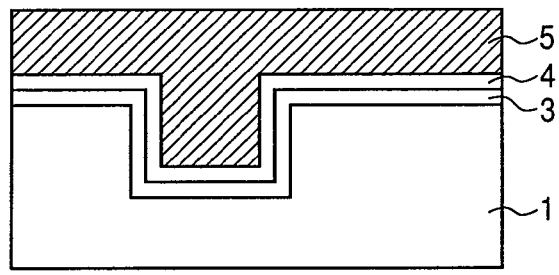
FIG. 3 is a process cross-sectional view for illustrating the method of manufacturing the semiconductor device according to the embodiment 1.

Next, the Cu alloy seed film 4 is subjected to a plating treatment. This results in the formation of a plated Cu film (that may be comprehended as a copper layer) 5 so as to fill the groove 2 for lower layer wiring over the Cu alloy seed film 4, as shown in FIG. 3. Here, the upper face of the plated Cu film 5 to be formed lies at a higher position than the upper face of the first interlayer insulating film 1 (more specifically, the upper face of the Cu alloy seed film 4 formed over the first interlayer insulating film 1).

Next, the structure as shown in FIG. 3 is subjected to a first heat treatment in a first atmosphere that does not oxidize the plated Cu film 5. The first heat treatment makes the first metal element contained in the Cu alloy seed film 4 diffuse into the plated Cu film 5. Namely, the first heat treatment converts the plated Cu film 5 into a metal layer of copper alloy including copper and the first metal element. Further, the first heat treatment grows the copper grain of the plated Cu film 5.

The first atmosphere is either a mixed gas atmosphere containing any of an inert gas, nitrogen gas and hydrogen gas, or a vacuum atmosphere, in order to prevent the oxidation of copper. Meanwhile, in order to prevent the oxidation of copper, the oxygen contained in the first atmosphere should be 1 ppm or less. Further, the first heat treatment is performed at a temperature from not less than 100° C. to not more than 450° C. for from not less than 3 minutes to not more than 6 hours. More desirable condition of the first heat treatment is from 100° C. for 10 minutes or more to 450° C. for 30 minutes or less.

Meanwhile, although it differs from the above, the first heat treatment may be performed in an oxygen-containing atmosphere and the like in order to precipitate the oxide of the first metal element over the surface of the plated Cu film 5 for the purpose of adjusting the concentration of the first metal element in the plated Cu film 5.

Figure 4:
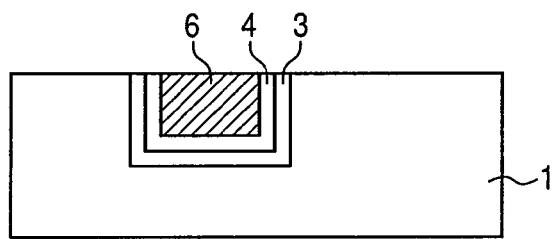
FIG. 4 is a process cross-sectional view for illustrating the method of manufacturing the semiconductor device according to the embodiment 1.

Next, the upper face of the plated Cu film 5 (metal layer of copper alloy) into which the first metal element has diffused is subjected to a CMP (Chemical Mechanical Polishing) treatment. The CMP treatment is performed until the upper face of the Cu alloy seed film 4 formed in the groove 2 for lower layer wiring and the upper face of the first interlayer insulating film 1 are exposed. The CMP treatment removes an excess metal layer of copper alloy outside the groove 2 for lower layer wiring to form lower layer Cu alloy wiring 6 in the groove 2 for lower layer wiring, as shown in FIG. 4. Namely, a structure, in which the first barrier metal 3 is formed between the groove 2 for lower layer wiring and the lower layer Cu alloy wiring 6, is formed.

The lower layer Cu alloy wiring 6 is copper alloy wiring containing copper and the first metal element. Here, as described above, the first metal element is any of metal elements of aluminum, titanium, manganese, tin, silver and magnesium.

Figure 5:
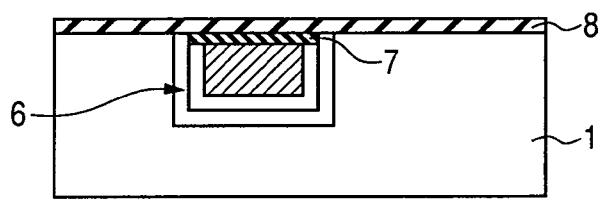
FIG. 5 is a process cross-sectional view for illustrating the method of manufacturing the semiconductor device according to the embodiment 1.

Next, the structure as shown in FIG. 4 is subjected to a second heat treatment in a second atmosphere containing oxygen (oxidative atmosphere). The second heat treatment results in the formation of an oxide layer 7 of the oxide of the first metal element over the surface (whole upper face) of lower layer Cu alloy wiring 6, as shown in FIG. 5. When the first metal element is aluminum, for example, an oxidized aluminum film ($Al_2O_3$) is formed as the oxide layer 7.

Here, the second heat treatment is either performed in the second atmosphere containing 5 ppm or more of oxygen under such conditions as a pressure of 1-1000 Pa and a temperature from not less than 100° C. to not more than 450° C. The second atmosphere may be an oxidizing atmosphere, and may not be an atmosphere that contains only oxygen gas. For example, the second atmosphere may be an oxidizing atmosphere that contains $N_2O$ gas.

Next, for the purpose of preventing the diffusion of copper into an interlayer insulating film, a metal diffusion-preventing film 8 is formed over the first interlayer insulating film 1 and over the oxide layer 7 (or lower layer Cu alloy wiring 6), as shown in FIG. 5. Here, as the metal diffusion-preventing film 8, an insulating film containing any of compounds of silicon and nitrogen (such as SiN and SiCN), SiCO and SiC may be employed.

Figure 6:
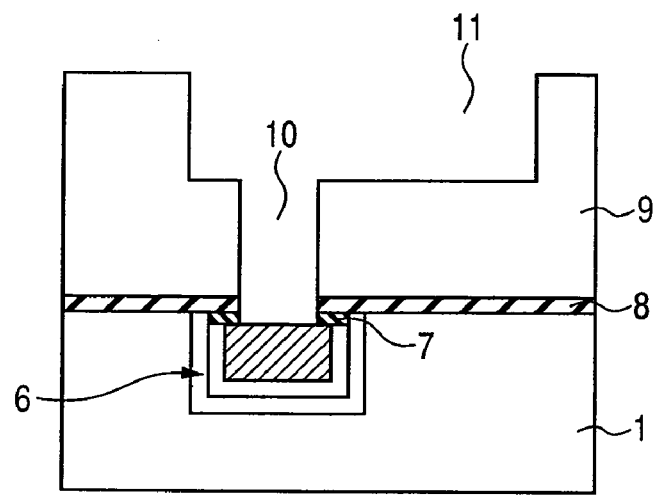
FIG. 6 is a process cross-sectional view for illustrating the method of manufacturing the semiconductor device according to the embodiment 1.

Next, over the metal diffusion-preventing film 8, a second interlayer insulating film (a film that may be comprehended as a second interlayer film) 9 is formed, as shown in FIG. 6. After that, a first hole 10 is formed which penetrates through the second interlayer insulating film 9, the metal diffusion-preventing film 8 and the oxide layer 7, as shown in FIG. 6. After that, in the second interlayer insulating film 9, a groove 11 having a prescribed depth and a prescribed shape for upper layer wiring is formed, as shown in FIG. 6.

As understood from the above description, due to the formation of the first hole 10, the oxide layer 7 directly under the first hole 10 has been removed. Namely, from the bottom face of the first hole 10, the upper face of the lower layer Cu alloy wiring 6 is exposed. On the other hand, the oxide layer 7 remains on the upper face of the lower layer Cu alloy wiring 6 other than the lower layer Cu alloy wiring 6 that is exposed from the bottom portion of the first hole 10.

The first hole 10 is formed by subjecting the second interlayer insulating film 9, the metal diffusion-preventing film 8 and the oxide layer 7 to an etching treatment below. Here, the etching treatment is a dry etching treatment employing a mixed gas (for example, $Cl_2/Ar$ or $Cl_2/BCl_3$) containing a gas containing Cl (chlorine) or Br (bromine) (such as $Cl_2$, $BCl_3$ and HBr).

Next, in order to remove adsorbed moisture, a semiconductor device on the way of production is heated at a temperature of not less than 100° C. Furthermore, in order to reduce copper for the exposed lower layer Cu alloy wiring 6, a semiconductor device on the way of production is subjected to a plasma treatment or a heat treatment in an atmosphere containing any gas of hydrogen gas, helium/hydrogen mixed gas, argon gas and neon gas.

Figure 7:
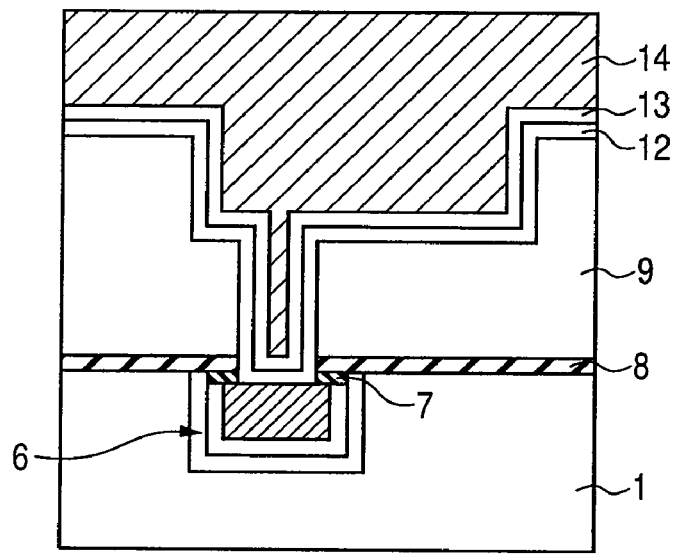
FIG. 7 is a process cross-sectional view for illustrating the method of manufacturing the semiconductor device according to the embodiment 1.

Next, a second barrier metal 12 is formed on the side and bottom faces of the first hole 10, on the bottom and side faces of the groove 11 for upper layer wiring, and over the second interlayer insulating film 9 by a film-forming treatment through a sputtering treatment or a CVD method (refer to FIG. 7). Here, the second barrier metal 12 includes a laminated film of a TaN film and a Ta film. In addition, as the second barrier metal 12, a film containing at least any of the second metal elements selected from tantalum, tungsten, titanium, ruthenium, magnesium and vanadium, nitride with the second metal element, or oxide with the second metal element may be employed.

Next, the second barrier metal 12 is subjected to a sputtering treatment. This results in the formation of a Cu (copper) alloy seed film (that may be comprehended as copper alloy layer) 13 over the second barrier metal 12, as shown in FIG. 7. Specifically, the Cu alloy seed film 13 containing copper and the first metal element is formed on the side and bottom faces of the first hole 10, on the bottom and side faces of the groove 2 for lower layer wiring, and over the second interlayer insulating film 9 via the second barrier metal 12.

Here, as the first metal element, as described above, a metal element that contains any of Al (aluminum), Ti (titanium), Mn (manganese), Sn (tin), Ag (silver) and Mg (magnesium) may be employed.

Next, the Cu alloy seed film 13 is subjected to a plating treatment. This results in the formation of a plated Cu film (that may be comprehended as a copper layer) 14 over the Cu alloy seed film 13 so as to fill the first hole 10 and the groove 11 for upper layer wiring, as shown in FIG. 7. Here, the upper face of the plated Cu film 14 to be formed lies at a higher position than the upper face of the second interlayer insulating film 9 (more specifically, the upper face of the Cu alloy seed film 13 formed over the second interlayer insulating film 9).

Next, the structure as shown in FIG. 7 is subjected to the same first heat treatment as the above in the same first atmosphere as the above so as not to oxidize the plated Cu film 14. The first heat treatment converts the plated Cu film 14 into a metal layer of copper alloy including copper and the first metal element. Furthermore, the first heat treatment grows the copper grain of the plated Cu film 14.

Figure 8:
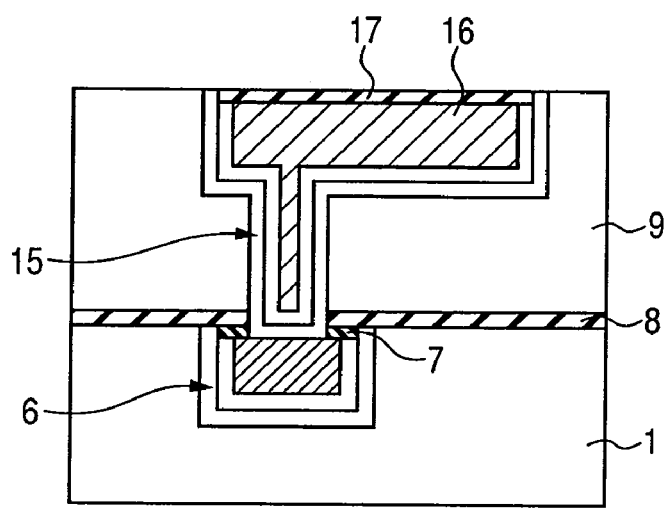
FIG. 8 is a process cross-sectional view for illustrating the method of manufacturing the semiconductor device according to the embodiment 1.

Next, the upper face of the plated Cu film 14 (metal layer of a copper alloy) into which the first metal element has diffused is subjected to a CMP treatment. The CMP treatment is performed until the upper face of the Cu alloy seed film 13 formed in the groove 11 for upper layer wiring and the upper face of the second interlayer insulating film 9 are exposed. The CMP treatment removes an excess metal layer of copper alloy outside the first hole 10 and the groove 11 for upper layer wiring. Thus, a via plug 15 constituted of a copper alloy is formed in the first hole 10, and upper layer Cu alloy wiring 16 is formed in the groove 11 for upper layer wiring, as shown in FIG. 8.

The via plug 15 and the upper layer Cu alloy wiring 16 are copper alloy wiring containing copper and the first metal element. Here, the first metal element is any metal elements of aluminum, titanium, manganese, tin, silver and magnesium, as described above.

Next, a semiconductor device on the way of production in which the via plug 15 and the upper layer Cu alloy wiring 16 have been formed is subjected to the same second heat treatment as the above in a second atmosphere containing oxygen (in an oxidizing atmosphere). The second heat treatment results in the formation of an oxide layer 17 that is the oxide of the first metal element over the face (the whole upper face) of the upper layer Cu alloy wiring 16, as shown in FIG. 8.

As described above, in the method according to the present embodiment for manufacturing a semiconductor device, Cu alloy wirings 6 and 16 are formed as wiring, and, after forming the Cu alloy wirings 6 and 16, they are subjected to the second heat treatment in the second atmosphere containing oxygen. This results in the formation of oxide layers 7 and 17 over the whole upper face of the Cu alloy wirings 6 and 16.

The oxide layers 7 and 17 containing the first metal element can further prevent the diffusion of copper and holes at the upper face of the Cu alloy wirings 6 and 16, as compared with the metal diffusion-preventing film 8 (SiCN, SiN) that is generally employed for the purpose of preventing the diffusion of copper. Namely, the formation of the oxide layers 7 and 17 can retard the diffusion of copper and holes at the upper face of the Cu alloy wirings 6 and 16. Accordingly, as a result, such faults of the Cu alloy wirings 6 and 16 as electromigration and stress migration can be suppressed.

Further, in the method according to the present embodiment for manufacturing a semiconductor device, the grooves 2 and 11 are formed in the interlayer insulating films 1 and 9, and, after that, the Cu seed layer is formed, and, after that, copper is buried into the grooves 2 and 11 by a plating method. Further, the metal layer of copper alloy (Cu+first metal element) is formed by performing the first heat treatment in the first atmosphere, and, after that, the metal layer of copper alloy is subjected to a CMP treatment. Furthermore, after that, the second heat treatment is performed in the second atmosphere to form the oxide layers 7 and 17 being the oxide of the first metal element on the whole upper face of the Cu alloy wirings 6 and 16.

For example, suppose that, after a plated Cu film is formed, an annealing treatment is performed in an oxidizing atmosphere instead of the first heat treatment in the first atmosphere containing no oxygen. On this occasion, the first metal element in copper diffuses to the copper surface. In this instance, when the second heat treatment is performed, after that, in the second atmosphere for forming the oxide layers 7 and 17, the concentration of the first metal element in the Cu alloy wirings 6 and 16 would be reduced.

In contrast, in the present embodiment, the oxide layers 7 and 17 are formed over the whole upper face of the Cu alloy wirings 6 and 16 after the CMP treatment, as described above. Accordingly, the formation of the oxide of the first metal element on the copper surface before the CMP treatment can be prevented. This makes it possible to prevent the lowering of the first metal element concentration in the Cu alloy wirings 6 and 16.

In addition, the first heat treatment in the first atmosphere prior to the CMP treatment can grow copper grain diameters. This makes it possible to assure the reliability of the Cu alloy wirings 6 and 16, and to lower the wiring resistivity.

Meanwhile, the oxide layers 7 and 17 formed over the whole upper face of the Cu alloy wirings 6 and 16 also function as a copper diffusion-preventing film. This also allows the improvement effect of TDDB (Time Dependent Dielectric Breakdown) properties in an inter-wiring insulating film to be exerted.

Figure 9:
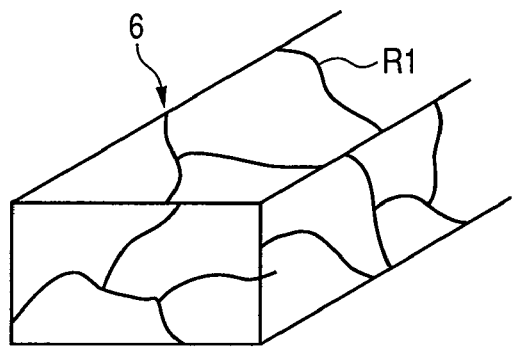
FIG. 9 is a drawing showing a constitution of wiring of the semiconductor device produced by a method of manufacturing a semiconductor device according to the present invention.

By the implementation of the above manufacturing method, a semiconductor device is formed, which is provided with the groove 2 formed in the first interlayer insulating film 1 formed over a semiconductor substrate and the Cu alloy wiring 6 that is formed in the groove 2 and constituted of a copper alloy containing copper and the first metal element. Here, there exists a grain boundary R1 of copper crystals in the Cu alloy wiring 6, as shown in FIG. 9.

Figure 10:
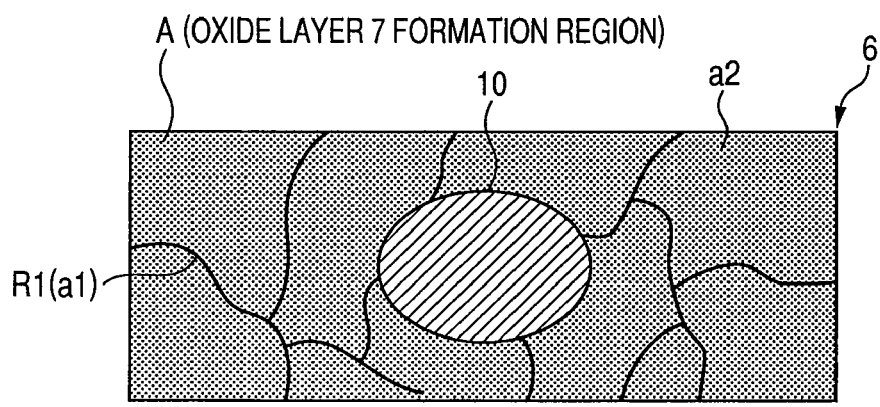
FIG. 10 is a drawing showing a constitution of wiring of the semiconductor device produced by the method of manufacturing a semiconductor device according to the present invention.

Here, the semiconductor device produced by the above manufacturing method is further provided with the oxide layer 7 being the oxide of the first metal element that is formed in any region of the surface of the Cu alloy wiring 6. FIG. 10 is a plan view of the Cu alloy wiring 6. As shown in FIG. 10, the oxide layer 7 has been removed from the bottom face (hatched region) of the first hole 10 of the Cu alloy wiring 6, and the oxide layer 7 is formed in the other regions (regions other than the hatched region) A. More specifically, in the region A, the oxide layer 7 is formed in a first regional lying along the grain boundary R1 of copper crystals and a second region (sandy region) a2 surrounded by the grain boundary R1, as shown in FIG. 10.

Further, by the implementation of the above manufacturing method, the thickness of the oxide layer 7 formed in the first region a1 is thicker than that of the oxide layer 7 formed in the second region a2. This is because the first metal element diffused by the first heat treatment before the CMP treatment mainly exists at the grain boundary R1 of copper, and thus the oxide layer 7 is preferentially formed at the grain boundary R1 (first region a1) by the second heat treatment after the CMP treatment.

Since the thickness of the oxide layer 7 formed at the first region a1 is thicker than that of the oxide layer 7 formed at the second region a2, it is possible to effectively suppress the diffusion of copper atoms and holes at the grain boundary R1 that is a primary diffusion path of copper or voids. Namely, caused by the constitution of the oxide 7 of the Cu alloy wiring 6, the generation of such fault as disconnection of the Cu alloy wiring 6 can be suppressed.

Embodiment 2

Hereinafter, on the basis of the process cross-sectional view, a method according to an embodiment 2 for manufacturing a semiconductor device will be described.

Firstly, the manufacturing processes described in the embodiment 1 using FIGS. 1 to 5 are performed also in the present embodiment in the same way. This results in the formation of the structure as shown in FIG. 5.

In the structure as shown in FIG. 5, the lower layer Cu alloy wiring 6 having a prescribed shape is formed in the plane of the first interlayer insulating film 1. Here, between the lower layer Cu alloy wiring 6 and the first interlayer insulating film 1, the first barrier metal 3 is formed. Also, over the whole upper face of the lower layer Cu alloy wiring 6, the oxide layer 7 being the oxide of the first metal element is formed. Above the upper face of the lower layer Cu alloy wiring 6 (more specifically, above the oxide layer 7) and on the upper face of the first interlayer insulating film 1, the metal diffusion-preventing film 8 is formed.

Figure 11:
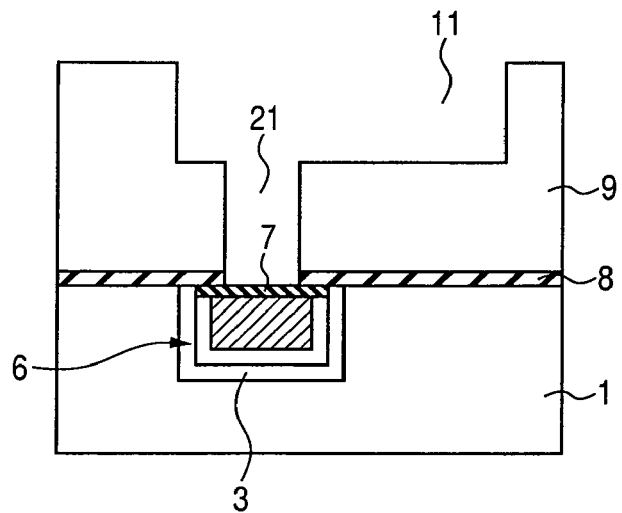
FIG. 11 is a process cross-sectional view for illustrating a method of manufacturing a semiconductor device according to an embodiment 2.

Next, the second interlayer insulating film (one that may be comprehended as the second interlayer film) 9 is formed over the metal diffusion-preventing film 8, as shown in FIG. 11. After that, a first hole 21 is formed which penetrates through the second interlayer insulating film 9 and the metal diffusion-preventing film 8, as shown in FIG. 11. Also, as shown in FIG. 11, a groove 11 for upper layer wiring having a prescribed depth and a prescribed shape is formed in the plane of the second interlayer insulating film 9.

Here, as the result of forming the first hole 21, the oxide layer 7 is exposed from the bottom face of the first hole 21, as can be understood from the above. Namely, in the embodiment 1, the oxide layer 7 directly under the first hole 10 has been removed when the first hole 10 is formed. In contrast, in the present embodiment, the oxide layer 7 is not removed when the first hole 21 is formed. Accordingly, just after the first hole 21 is formed, the upper face of the lower layer Cu alloy wiring 6 is not exposed, but the oxide layer 7 remains over the whole upper face of the lower layer Cu alloy wiring 6.

This makes it possible to suppress the re-oxidization of the lower layer Cu alloy wiring 6 in processes after the formation of the first hole 21.

The first hole 21 is formed, for example, by an etching treatment as shown below being provided to the second interlayer insulating film 9 and the metal diffusion-preventing film 8. Here, the etching treatment is a dry etching using such mixed gas (such as $CF_4/Ar$ and $C_4F_8/N_2/Ar$) formed by mixing a gas containing fluorine ($CF_4$, $C_4F_8$, $SF_6$) with such non-volatile gas as argon or nitrogen gas.

Figure 12:
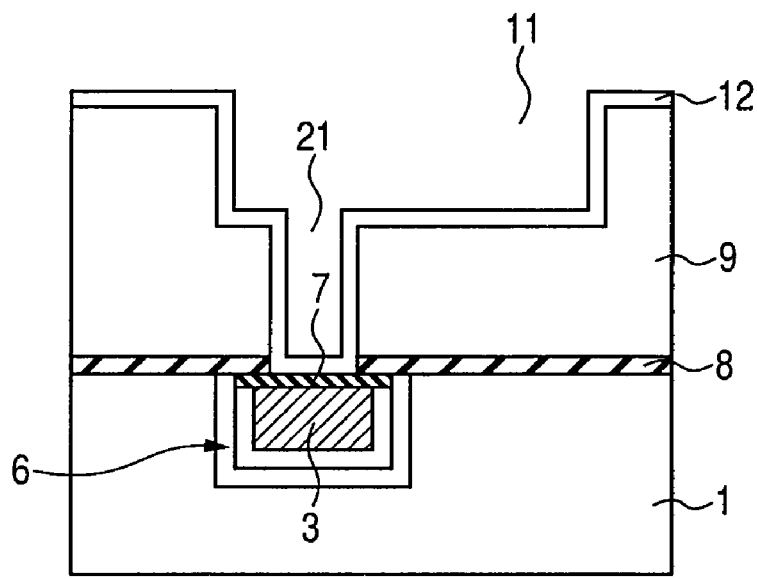
FIG. 12 is a process cross-sectional view for illustrating the method of manufacturing the semiconductor device according to the embodiment 2.

Next, on side and bottom faces of the first hole 21, on the bottom and side faces of the groove 11 for upper layer wiring, and over the second interlayer insulating film 9, a second barrier metal 12 is formed (refer to FIG. 12) by a film-forming treatment through a sputtering treatment or a CVD method. Here, the second barrier metal 12 is a laminated film of a TaN film and a Ta film. As the second barrier metal 12, also a film containing at least any of the second metal elements selected from tantalum, tungsten, titanium, ruthenium, magnesium, vanadium, nitrides with the second metal elements, and oxides with the second metal elements may be employed.

Figure 13:
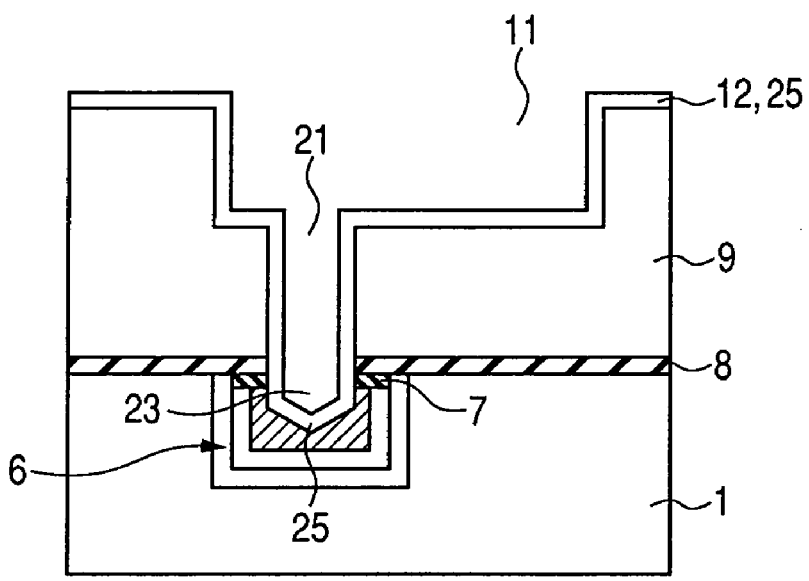
FIG. 13 is a process cross-sectional view for illustrating the method of manufacturing the semiconductor device according to the embodiment 2.

Next, by a vacuum continuous treatment in the same apparatus as that used for forming the second barrier metal 12, the bottom portion of the first hole 21 is subjected to an etching treatment. By the etching treatment, the second barrier metal 12, the oxide layer 7 and a part of the upper face of the lower layer Cu alloy wiring 6 that are formed directly under the first hole 21 are removed, as shown in FIG. 13.

Namely, by the etching treatment, the lower layer Cu alloy wiring 6 is exposed from the bottom face of the first hole 21. On the other hand, on the other upper face of the lower layer Cu alloy wiring 6 than lower layer Cu alloy wiring 6 that is exposed from the bottom portion of the first hole 21, the oxide layer 7 remains (refer to FIG. 13). In addition, by the etching treatment, a concavity 23 having a prescribed depth is formed to the lower layer Cu alloy wiring 6 directly under the first hole 21 (refer to FIG. 13). Here, it is satisfactory that the oxide layer 7 has been removed directly under the first hole 21, and the prescribed depth of the concavity 23 that is formed to the lower layer Cu alloy wiring 6 may be any value.

Meanwhile, as the etching treatment to be performed after the first hole 21 and the second barrier metal film 12 are formed, any of such treatments as a plasma treatment, a wet treatment and a sputtering treatment may be employed. Any treatment can remove the second barrier metal film 12 and the oxide layer 7 directly under the first hole 21.

For example, in the case of a plasma treatment, a dry etching treatment is performed employing such mixed gas (such as $Cl_2/Ar$ and $Cl_2/BCl_3$) containing a gas containing Cl (chlorine) or Br (bromine) (such as $Cl_2$, $BCl_3$ and HBr). Alternatively, a sputter etching is performed in an atmosphere containing hydrogen gas (in a mixed gas of $H_2$ and Ar, and the like).

As the wet treatment, it is performed, for example, using a carbonate (such as ammonium carbonate and ammonium hydrogen carbonate), carbonic acid, ozone or water. Alternatively, dissolution with NaOH or nitrohydrochloric acid is performed.

As the sputtering treatment, it is performed employing an inert gas containing any of argon, neon, xenon, krypton, hydrogen and nitrogen. Meanwhile, by the sputtering treatment, a concavity of cone-shape, semi-circle, truncated cone-shape or the like (that may be comprehended as a second hole) 23 is formed at the lower layer Cu alloy wiring 6 directly under the first hole 21.

Next, in the same apparatus as that used for removing the oxide layer 7 and for forming the concavity 23 for the lower layer Cu alloy wiring 6, by a vacuum continuous treatment, a third barrier metal 25 is formed as shown in FIG. 13.

Here, the third barrier metal 25 is formed by a film-forming treatment through a sputtering treatment or a CVD method. The third barrier metal 25 is formed also over the second barrier metal 12 already formed, as well as inside the concavity 23 for the lower layer Cu alloy wiring 6. Meanwhile, as the third barrier metal 25, a film that contains at least any of the second metal elements selected from tantalum, tungsten, titanium, ruthenium, magnesium and vanadium, an nitride with the second metal element, and an oxide with the second metal element may be employed.

Subsequently, by a vacuum continuous treatment in the same apparatus as the above, the Cu (copper) alloy seed film (that may be comprehended as a copper alloy layer) 13 is formed over the second and third barrier metals 12 and 25 (refer to FIG. 14). The Cu alloy seed film 13 is formed by a sputtering treatment. The Cu alloy seed film 13 contains copper and the first metal element.

Here, as the first metal element, a metal element containing any of Al (aluminum), Ti (titanium), Mn (manganese), Sn (tin), Ag (silver) and Mg (magnesium) may be employed, as described above.

Next, the Cu alloy seed film 13 is subjected to a plating treatment. This forms the plated Cu film (that may be comprehended as a copper layer) 14 over the Cu alloy seed film 13 so as to fill the concavity 23, the first hole 21 and the groove 11 for upper layer wiring, as shown in FIG. 14. Here, the upper face of the plated Cu film 14 to be formed lies at a higher position than the upper face of the second interlayer insulating film 9 (more specifically, the upper layer of the Cu alloy seed film 13 formed over the second interlayer insulating film 9).

Figure 14:
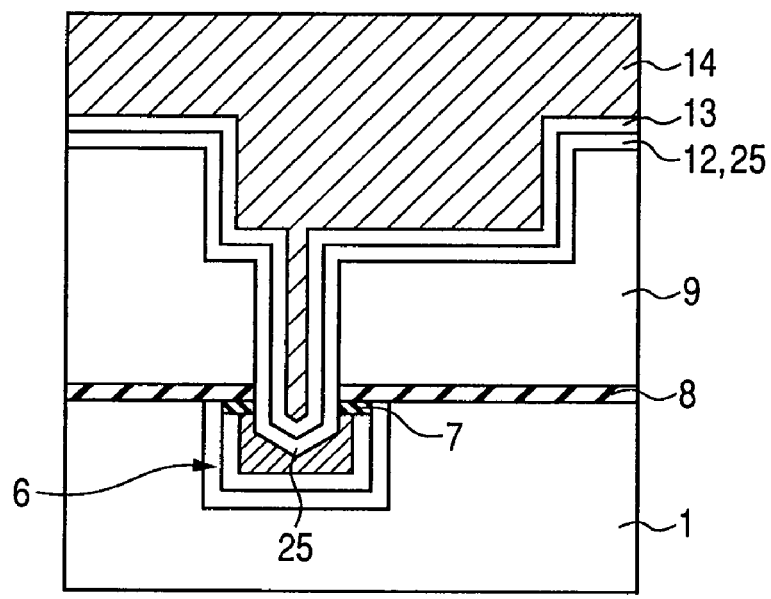
FIG. 14 is a process cross-sectional view for illustrating the method of manufacturing the semiconductor device according to the embodiment 2.

Next, the structure as shown in FIG. 14 is subjected to the same first heat treatment as the above in the same first atmosphere as the above, so as not to oxidize the plated Cu film 14.

The first heat treatment converts the plated Cu film 14 into a metal layer of copper alloy including copper and the first metal element. Furthermore, the first heat treatment grows copper grains of the plated Cu film 14.

Figure 15:
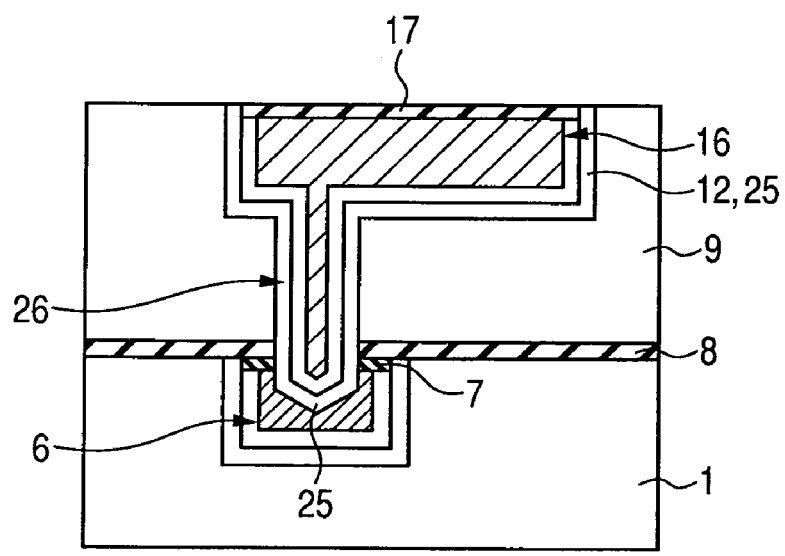
FIG. 15 is a process cross-sectional view for illustrating the method of manufacturing the semiconductor device according to the embodiment 2.

Next, the upper face of the plated Cu film 14 (metal layer of copper alloy) into which the first metal element has diffused is subjected to a CMP treatment. The CMP treatment is performed until the upper face of the Cu alloy seed film 13 formed in the groove 11 for upper layer wiring and the upper face of the second interlayer insulating film 9 are exposed. The CMP treatment removes an excess metal layer of copper alloy. Then, a via plug 26 constituted of the copper alloy is formed in the first hole 21 and the concavity 23, and the upper layer Cu alloy wiring 16 is formed in the groove 11 for upper layer wiring, as shown in FIG. 15.

The via plug 26 and the upper layer Cu alloy wiring 16 constitutes copper alloy wiring containing copper and the first metal element. Here, the first metal element is any of metal elements of aluminum, titanium, manganese, tin, silver and magnesium, as described above.

Next, a semiconductor device on the way of production, in which the via plug 26 and the upper layer Cu alloy wiring 16 have been formed, is subjected to the same second heat treatment as the above in the second atmosphere containing oxygen (oxidative atmosphere). The second heat treatment forms the oxide layer 17 being the oxide of the first metal element over the surface (whole upper face) of the upper layer Cu alloy wiring 16, as shown in FIG. 15.

The method according to the present embodiment for manufacturing a semiconductor device is provided with the above processes. Accordingly, it exerts the same effect as that described in the embodiment 1. Also the semiconductor device produced by the manufacturing method according to the present embodiment has the constitution that was described using FIGS. 9 and 10. Accordingly, also the semiconductor device produced by the manufacturing method of the present embodiment has the same effect as that exerted by the semiconductor device produced by the manufacturing method according to the embodiment 1.

Further, in the method according to the present embodiment for manufacturing a semiconductor device, the first hole 21 is formed so that the oxide layer 7 is exposed. Furthermore, after the second barrier metal 12 is formed, the oxide layer 7 directly under the first hole 21 is removed and, at the same time, the concavity 23 is formed in the lower layer Cu alloy wiring 6 directly under the first hole 21. After that, the third barrier metal 25, the Cu alloy seed film 13 and the plated Cu film 14 are also formed.

Accordingly, it is possible to omit "the process of providing a heat treatment for removing adsorbed moisture" and "the process of providing a plasma treatment or a heat treatment for copper reduction to the exposed lower layer Cu alloy wiring 6", which have been described in the embodiment.

Meanwhile, in the respective embodiments, suppose that a semiconductor device on the way of production is left as it is after the lower layer Cu alloy wiring 6 (or the upper layer Cu alloy wiring 16) is subjected to a CMP treatment until sufficient oxygen is adsorbed to the Cu surface. In this case, even when an annealing treatment in a high vacuum is employed as the second heat treatment, a sufficient oxide layer 7 (or an oxide layer 7) may be formed on the Cu surface.

Here, sufficient oxygen may be adsorbed to the Cu surface by leaving a semiconductor device on the way of production after the CMP treatment as it is in a general clean room for around half a day. The length of the time during which the device is left varies in accordance with the temperature and humidity in the clean room.

Meanwhile, the present invention can be applied to general semiconductor devices using wiring containing copper, starting from the leading-edge SoC (System On a Chip).

What is claimed is:

1. A method of manufacturing a semiconductor device comprising the steps of:
   (A) forming a groove in a first interlayer film over a semiconductor substrate;
   (B) forming a copper alloy layer comprising copper and a first metal element on the bottom face and the side face of the groove;
   (C) forming a copper layer on the copper alloy layer so as to fill the groove;
   (D) performing a first heat treatment in a first atmosphere that does not oxidize the copper layer to convert the copper layer into a metal layer of copper alloy comprising copper and the first metal element;
   (E) removing the metal layer of copper alloy outside the groove to form wiring in the groove; and
   (F) performing a second heat treatment in a second atmosphere containing oxygen to form an oxide layer being the oxide of the first metal element over the surface of the wiring.

2. The method of manufacturing a semiconductor device according to claim 1,
   wherein the first metal element is a metal element including any of aluminum, titanium, manganese, tin, silver and magnesium.

3. The method of manufacturing a semiconductor device according to claim 1,
   wherein the first atmosphere is either a mixed gas atmosphere including any of an inert gas, nitrogen gas and hydrogen gas, or a vacuum atmosphere.

4. The method of manufacturing a semiconductor device according to claim 1 further comprising the steps of:
   (G) after the step (F), forming a metal diffusion-preventing film over the first interlayer film and over the oxide layer;
   (H) forming a second interlayer film over the metal diffusion-preventing film; and
   (I) forming a first hole penetrating through the second interlayer film and the metal diffusion-preventing film so as to expose the oxide layer.

5. The method of manufacturing a semiconductor device according to claim 4 further comprising the steps of:
   (J) between the step (A) and the step (B), forming a first barrier metal to the bottom face and the side face of the groove; and
   (K) forming a second barrier metal to the side face and the bottom face of the first hole.

6. The method of manufacturing a semiconductor device according to claim 4,
   wherein the metal diffusion-preventing film is an insulating film comprising any of a compound of silicon and nitrogen, SiCO and SiC.

7. The method of manufacturing a semiconductor device according to claim 5 further comprising the step of:
   (L) after the step (I), removing the oxide layer directly under the first hole by any of a plasma treatment, wet treatment and sputtering treatment.

8. The method of manufacturing a semiconductor device according to claim 7,
   wherein the step (L) is a step of removing the oxide layer directly under the first hole by the sputtering treatment using an inert gas including any of argon, neon, xenon, krypton and helium, or a gas containing the inert gas and either hydrogen or nitrogen, as well as forming a second hole having a shape of a cone, a semi-circle or a truncated cone in the wiring directly under the first hole; and the method further comprising the steps of:

(M) forming a third barrier metal at least inside the second hole;

(N) forming an upper copper alloy layer comprising copper and the first metal element over the second and third barrier metals, and;

(O) forming a copper layer over the upper copper alloy layer so as to fill the inside of the first hole and the second hole.

9. The method of manufacturing a semiconductor device according to claim 8, wherein the first to third barrier metals comprise at least any one of a second metal element selected from tantalum, tungsten, titanium, ruthenium, magnesium and vanadium, nitride with the second metal element and oxide with the second metal element.

10. A semiconductor device comprising:

a first interlayer film formed over a semiconductor substrate;

a groove formed in the first interlayer film;

a wiring formed in the groove and having a copper alloy comprising copper and a first metal element; and an oxide layer formed over the surface of the wiring and being an oxide of the first metal element, wherein the oxide layer is formed in a first region along a grain boundary of a copper crystal and a second region surrounded by the grain boundary, and the oxide layer formed in the first region has a thickness greater than that of the oxide layer formed in the second region.

11. The semiconductor device according to claim 10, wherein the first metal element is a metal element including any of aluminum, titanium, manganese, tin, silver and magnesium.

12. The semiconductor device according to claim 10 further comprising:

a first barrier metal formed between the groove and the wiring;

a metal diffusion-preventing film formed over the wiring and over the first interlayer film so as to contact with the oxide layer;

a second interlayer film formed over the metal diffusion-preventing film;

a first hole formed so as to penetrate through the second interlayer film and the metal diffusion-preventing film; and a second barrier metal formed on the side face of the first hole.

13. The semiconductor device according to claim 12, wherein the metal diffusion-preventing film is an insulating film comprising any one of compounds of silicon and nitrogen, SiCO and SiC.

14. The semiconductor device according to claim 12, wherein the oxide layer directly under the first hole has been removed.

15. The semiconductor device according to claim 14 further comprising:

a second hole formed in the wiring directly under the first hole and having a prescribed depth;

a third barrier metal formed at least inside of the second hole; and a via plug formed over the second and third barrier metals and including the copper and the first metal element.

16. The semiconductor device according to claim 15, wherein the first to third barrier metals include at least any one of second metal element selected from tantalum, tungsten, titanium, ruthenium, magnesium and vanadium, nitride with the second metal element, and oxide with the second metal element.

* * * * *